(12) United States Patent
Wang et al.

(10) Patent No.: US 8,012,810 B2
(45) Date of Patent: Sep. 6, 2011

(54) LOW PARASITIC CAPACITANCE BIT LINE PROCESS FOR STACK DRAM

(75) Inventors: Hsiao-Lei Wang, Tainan (TW); Chih-Hung Liao, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 0 days.

(21) Appl. No.: 12/703,965

(22) Filed: Feb. 11, 2010

(65) Prior Publication Data

US 2011/0111573 A1    May 12, 2011

(30) Foreign Application Priority Data

Nov. 11, 2009  (TW) .............................. 98138235 A

(51) Int. Cl.
*H01L 21/82* (2006.01)

(52) U.S. Cl. ........ 438/128; 438/396; 438/399; 438/599; 257/E21.646; 257/E21.658; 257/E21.66

(58) Field of Classification Search .................. 438/599, 438/709

See application file for complete search history.

(56) References Cited

U.S. PATENT DOCUMENTS 6,150,213 A * 11/2000 Luo et al. ..................... 438/253

* cited by examiner

*Primary Examiner* — Cheung Lee
(74) *Attorney, Agent, or Firm* — Rosenberg, Klein & Lee

(57) ABSTRACT

A method of manufacturing low parasitic capacitance bit line for stack DRAM, comprising the following steps: offering a semi-conductor base, which semi-conductor having already included an oxide, plural word line stacks, plural bit line stacks and plural polysilicons; applying a multi layer resist coat; removing the multi layer resist coat and further removing parts of the oxide located on the polysilicon to form contact holes exposing the plural polysilicons; depositing an oxide layer; etching the oxide layer to form the oxide layer spacer; depositing a polysilicon layer; performing lithography and etching on the polysilicon layer thereby allowing the rest of the polysilicon layer that is column-shaped to form capacitor contacts; and using another oxide to fill into the space among the word line stacks and the capacitor contacts.

18 Claims, 6 Drawing Sheets

LOW PARASITIC CAPACITANCE BIT LINE PROCESS FOR STACK DRAM

BACKGROUND OF THE INVENTION

1. Field of the Invention

The present invention relates to a method of manufacturing low parasitic capacitance bit line for stack dynamic random access memory (DRAM).

2. Description of Related Art

In semiconductor manufacturing methods, especially regarding to the stack dynamic random access memory (DRAM), it is well-known to use silicon nitride as the spacer so as to satisfy the needs for formation of capacitor contacts in the array during the processes of the manufacturing methods.

Refer first to FIG. 1, which shows a semiconductor base in the manufacturing method for the stack DRAM, wherein the semiconductor base depicted in FIG. 1 has been formed with a semiconductor base 1a through pre-processes such as diffusion, lithography, etching etc., which semiconductor base 1a comprising a stack 11a of plural bit lines, and the steps for forming bit lines having the silicon nitride spacer 12a include the following steps:

1. using silicon nitride to deposit a thin layer onto the semiconductor base 1a;
2. performing anisotropic etching, wherein the ions bombard on the deposited silicon nitride in a vertical direction, while the sidewalls of the stack are free of such a bombard thus retained to form the silicon nitride spacer 12a;
3. depositing an oxide layer onto the semiconductor base 1a;
4. performing chemical machine polishing (CMP) on the oxide layer;
5. forming the contact hole by means of lithography and etching;
6. filling the polysilicon to form the capacitor contact; and
7. performing CMP on the polysilicon.

However, in terms of the aforementioned approach for forming the bit line having the silicon nitride spacer, since the dielectric constant of silicon nitride tends to be comparatively higher, use of silicon nitride as the spacer may generate more significant parasitic capacitance which would cause greater interference to the circuitry, thus potentially jeopardizing the efficiency and quality of the operations in the stack DRAM.

Accordingly, in consideration of the above-illustrated drawbacks, the inventors of the present invention have disclosed the present invention which is reasonably designed and allows to eliminate the defects in prior art.

SUMMARY OF THE INVENTION

The essential objective of the present invention is to provide a method of manufacturing low parasitic capacitance bit line for stack dynamic random access memory (DRAM), in which the capacitance bit line fabricated by the manufacturing method according to the present invention may generate less significant parasitic capacitance.

To achieve the above-said objective, the present invention provides a method of manufacturing low parasitic capacitance bit line for stack dynamic random access memory (DRAM), comprising the following steps: offering a semiconductor base, which semi-conductor having an oxide, plural word line stacks, plural bit line stacks and plural polysilicons, which oxide being placed on the plural word line stacks and on the plural polysilicons not stacked with the plural bit line stacks thereon; applying a multi layer resist coat onto the upper surface of the semiconductor base; performing lithography and etching to remove parts of the multi layer resist coat to form holes, and further removing the oxide located over the plural polysilicons in the hole to form contact holes exposing the polysilicons; depositing an oxide layer; etching the oxide layer to form plural oxide layer spacers; depositing a polysilicon layer; performing lithography and etching on the polysilicon layer thereby allowing the rest of the polysilicon layer which is column-shaped to form capacitor contacts; and using another oxide to fill into the space among the word line stacks and the capacitor contacts.

The present invention provides the following effects: the approach of the present invention can be pertinently combined with the original method of manufacturing stack DRAM bit lines, and is able to demonstrate less significant parasitic capacitance when in use.

In order to further appreciate the characteristics and technical contents of the present invention, references are herein made to the detailed descriptions and appended drawings in connections with the present invention; whereas the appended drawings are simply illustrative and exemplary, rather than being intended to limit the present invention.

DETAILED DESCRIPTION OF THE PREFERRED EMBODIMENTS

Figure 1:
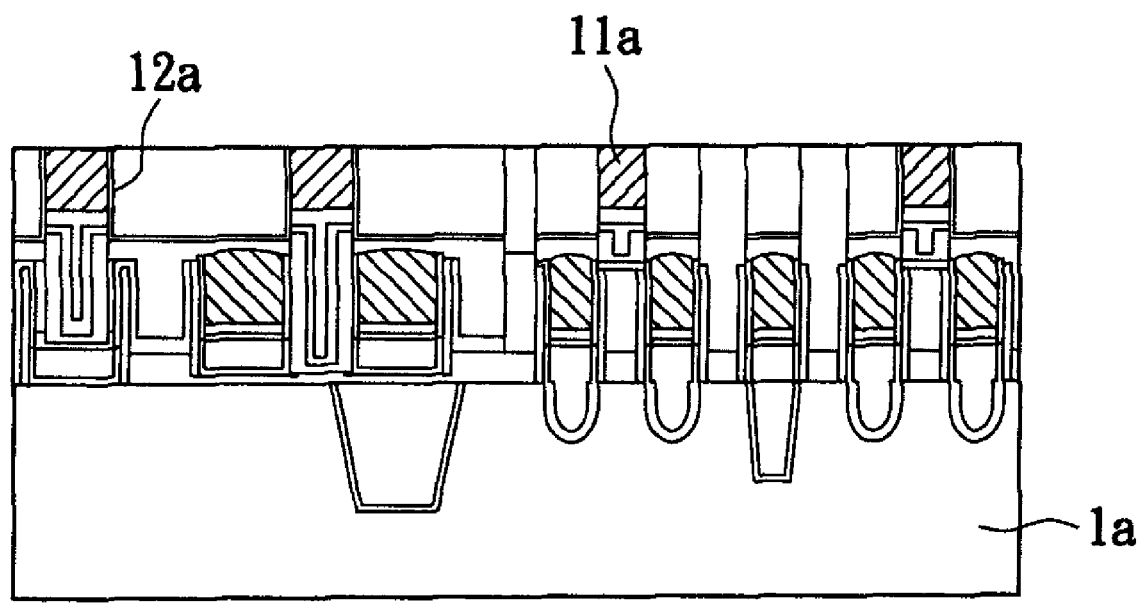
FIG. 1 is a diagram of a conventional stack dynamic random access memory (DRAM)
Figure 2:
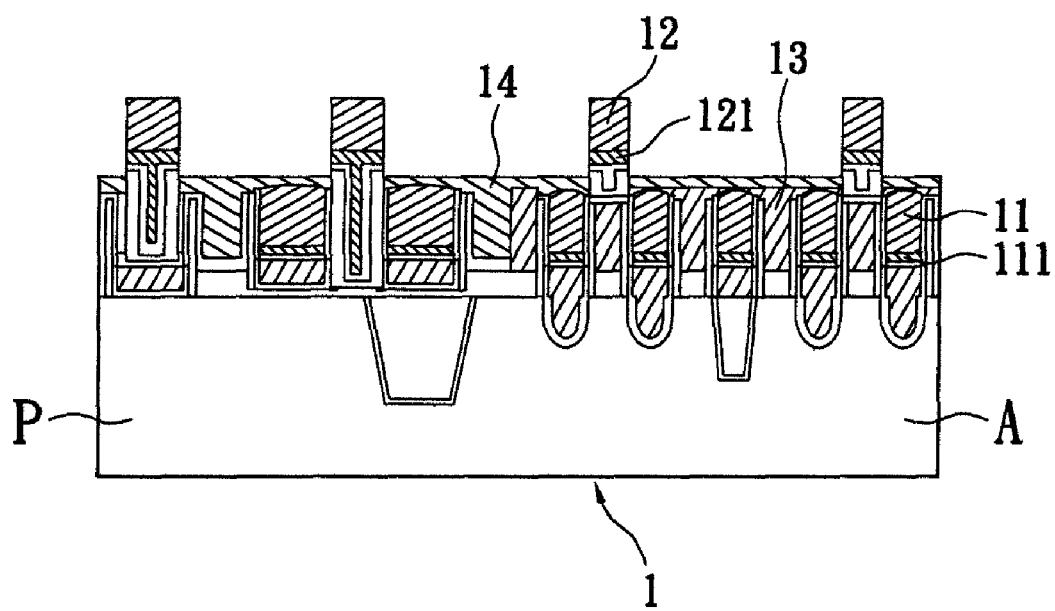
FIG. 2 is a diagram of Step (a) in accordance with the present invention.

Refer to FIGS. 2 to 9, wherein the present invention provides a method of manufacturing low parasitic capacitance bit line for stack dynamic random access memory (DRAM), and said manufacturing method is enabled to fabricate bit lines with less significant parasitic capacitance than conventional ones, which manufacturing method comprising the following steps:

Step (a): as referring to FIG. 2, wherein a base is provided which has been formed as the semiconductor base 1 through pre-processes such as diffusion, lithography and etching etc., in which the semiconductor base 1 consists of the array (A) and the periphery (P), and the semiconductor base 1 is configured with plural word line stacks 11 and plural bit line stacks 12, while each of the plural word line stacks 11 includes a word line 111, and each of the plural bit line stacks 12 includes a bit line 121. Such word line stacks 11 are adjacently placed in space with the plural polysilicons 13 in the array A, and such plural bit line stacks 12 are stacked over parts of the plural polysilicons 13. An oxide 14 is placed on the plural word line stacks 11 and on the plural polysilicons 13 not stacked with the plural bit line stacks 12.

Figure 3:
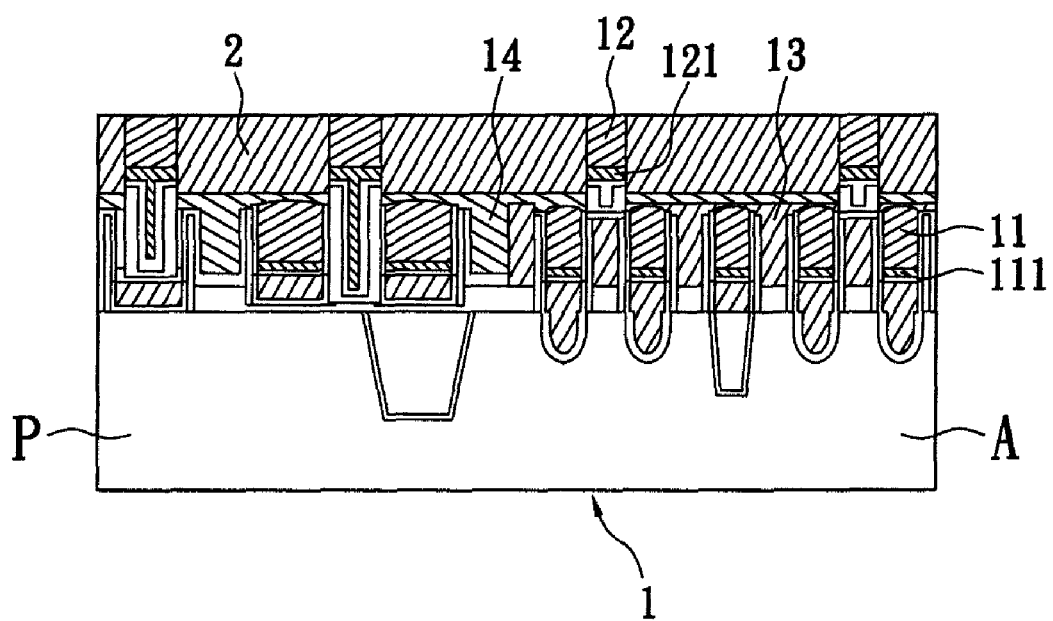
FIG. 3 is a diagram of Step (b) in accordance with the present invention.

Step (b): as referring to FIG. 3, wherein a multi layer resist (MLR) coat 2 is applied on the semiconductor base 1. The height of the MLR coat 2 is greater than those of the plural word line stacks 11. Since the profiles of the components (not shown) placed over the word line stacks 11 may vary, the result of lithography performed in the next step could be affected, and the application of the MLR coat 2 can advantageously facilitate planarization at the top of the MLR coat 2 thereby improving the accuracy and effect of lithography.

Figure 4A:
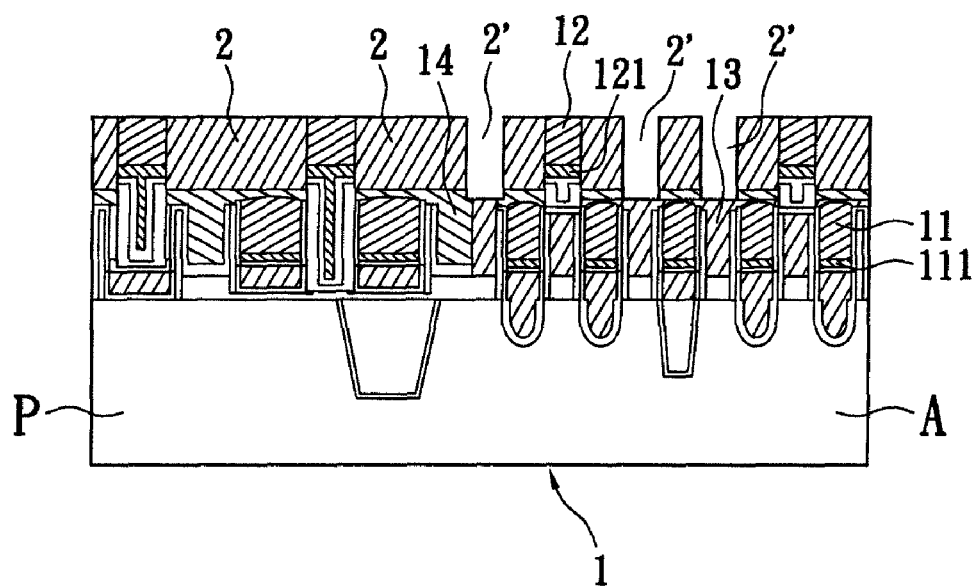
FIG. 4A is a diagram of Step (c) in accordance with the present invention.
Figure 4B:
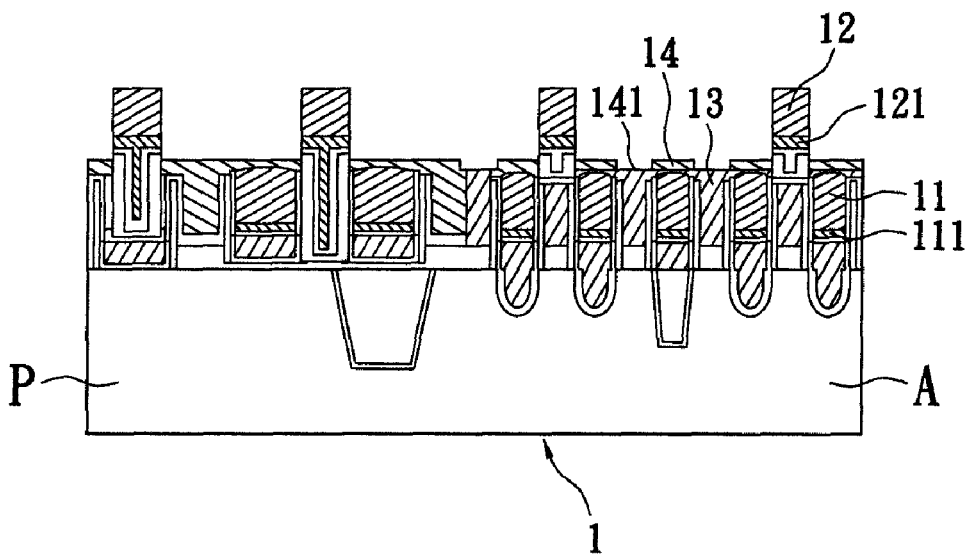
FIG. 4B is another diagram of Step (c) in accordance with the present invention.

Step (c): as referring to FIGS. 4A and 4B, wherein lithography (e.g., blocking the periphery P with masks and using positive photo-resist) and etching are performed so as to remove the MLR coat 2 to form holes 2' (as shown in FIG. 4A), and further remove the part of the oxide 14 located over the polysilicons 13 in the hole 2' in order to form contact holes 141 exposing the polysilicons 13 (as shown in FIG. 4B). Then the rest of the MLR coat 2 is discarded.

Figure 5:
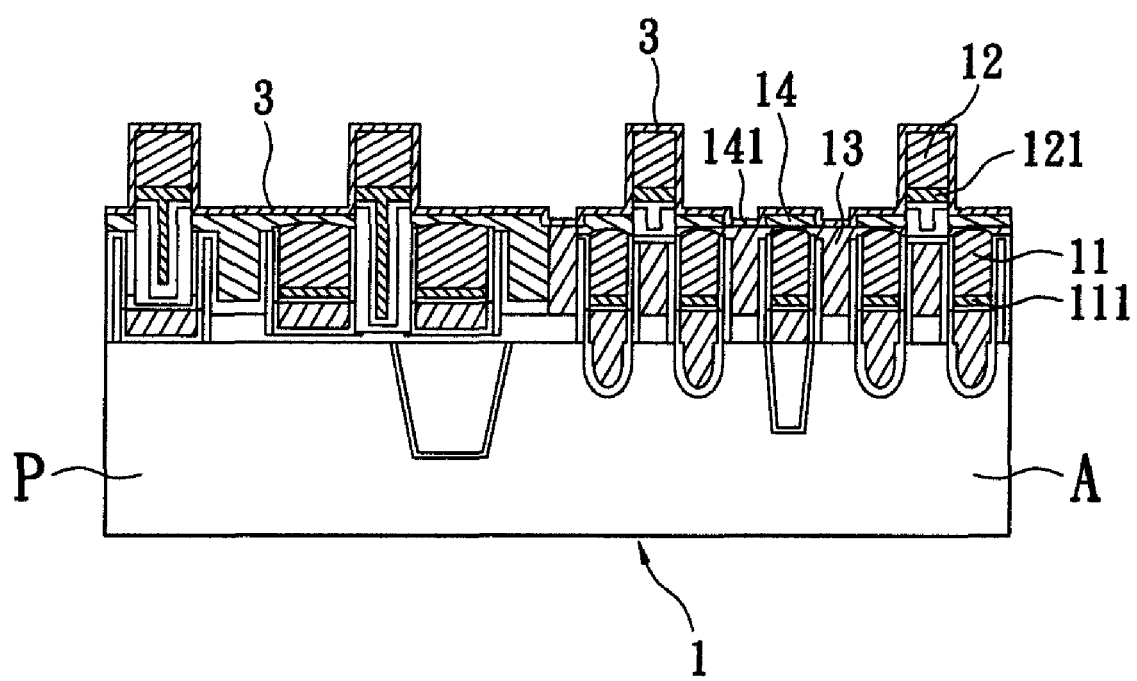
FIG. 5 is a diagram of Step (d) in accordance with the present invention.

Step (d): referring next to FIG. 5, wherein an oxide layer 3 is deposited.

Figure 6:
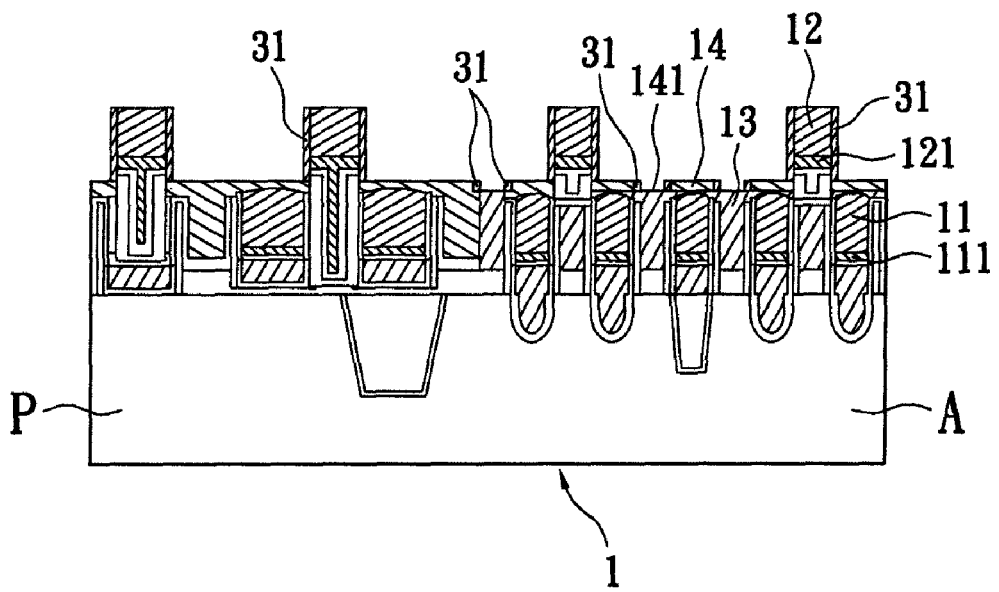
FIG. 6 is a diagram of Step (e) in accordance with the present invention.

Step (e): referring then to FIG. 6, wherein the oxide layer 3 is etched. At this point, the etch approach used in this step is anisotropic etching (which may be dry etch), and the oxide layer 3 in horizontal direction is etched, while the oxide layer 3 in vertical direction forms the oxide layer spacer 31 (as the sidewall).

Figure 7:
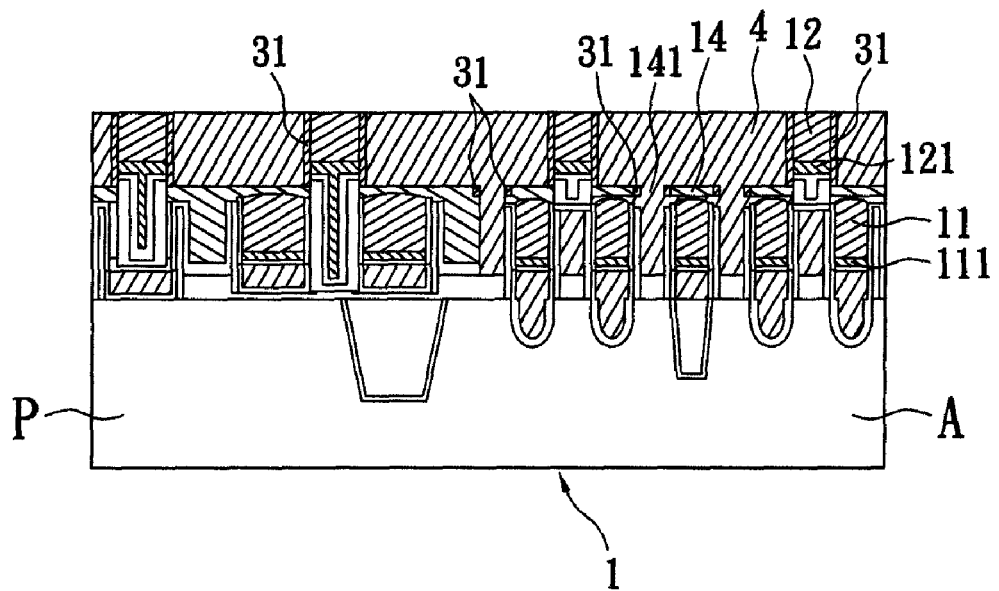
FIG. 7 is a diagram of Step (f) in accordance with the present invention.

Step (f): as referring to FIG. 7, wherein a polysilicon layer 4 is deposited, the height of the polysilicon layer 4 being greater than the one of the bit line stack 12, and then the part of the polysilicon layer 4 that is higher than the bit line stack 12 is removed by using CMP process and the upper surface of the polysilicon layer 4 is grind polished.

Figure 8:
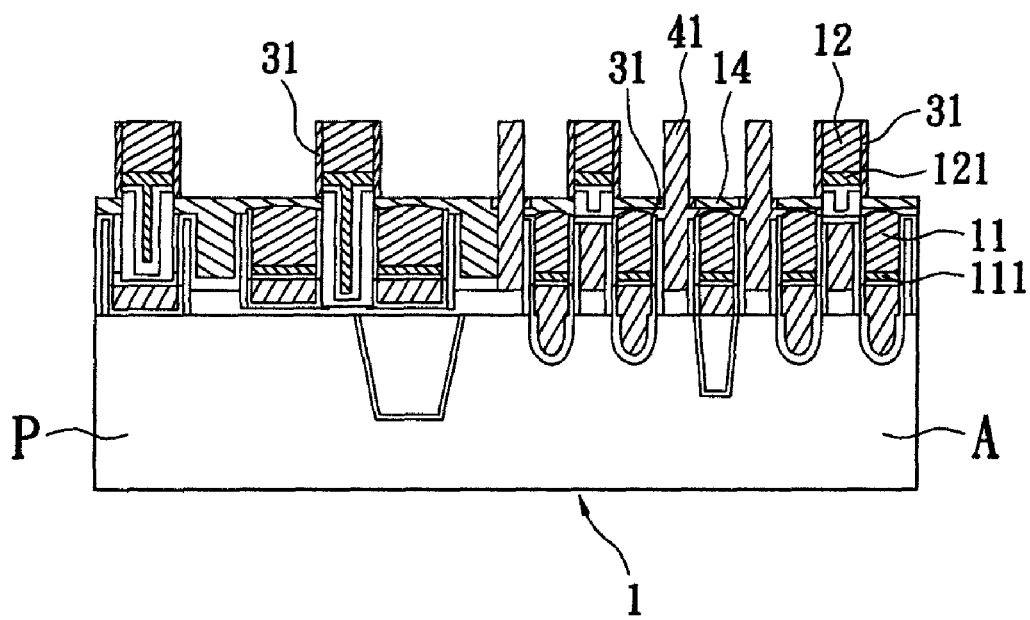
FIG. 8 is a diagram of Step (g) in accordance with the present invention.

Step (g): referring subsequently to FIG. 8, wherein lithography (e.g., blocking the portions of the array A to be formed as capacitor contacts with masks and using positive photo resist) and etching are performed on the polysilicon layer 4, and the rest of polysilicon layer 4 which is column-shaped becomes the capacitor contact 41. It is noticed that, since the etch selection ratio between the oxide layer 3 and the polysilicon layer 4 is comparatively higher than the one for the case of conventional silicon nitride layer and the oxide layer, Step (g) according to the present invention allows formation of plural capacitor contacts 41 through etching directly on polysilicon layer 4.

Figure 9:
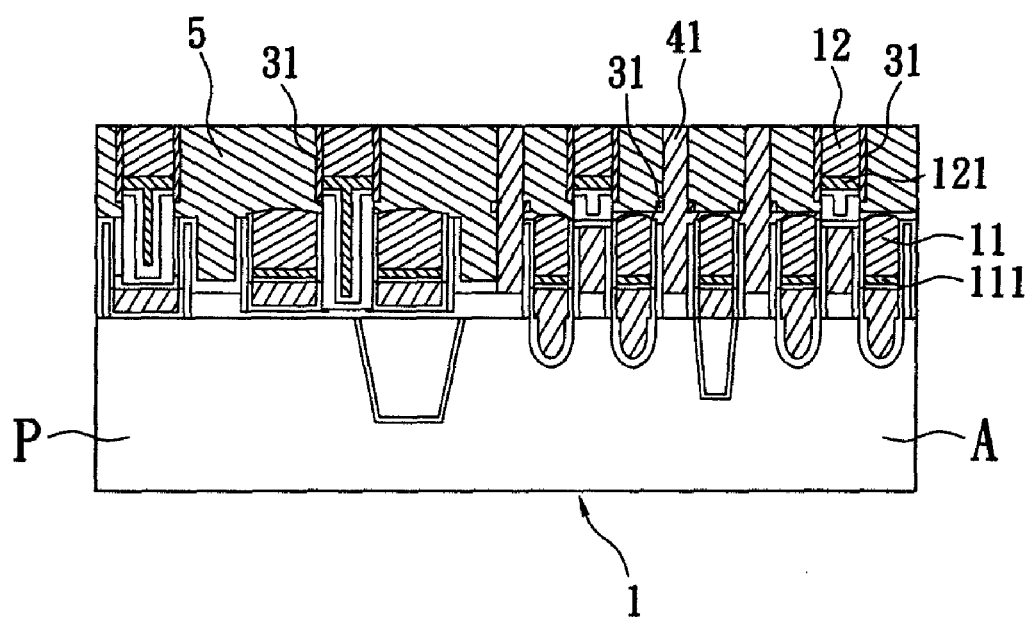
FIG. 9 is a diagram of Step (h) in accordance with the present invention.

Step (h): referring finally to FIG. 9, wherein, by using methods such as Spin on Glass (SOG), Spin on Deposition (SOD) or else boro-phosphosilicate glass (BPSG) deposition, in the space over the semiconductor base 1 another oxide 5 is placed to fill into among the word line stacks 11 and the capacitor contacts 41.

Accordingly, the present invention initially uses an oxide layer 3 to form the oxide layer spacer 31, and then since a good etch selection ratio exists between the oxide layer 3 and the polysilicon layer 4, plural capacitor contacts 41 can be directly formed in the polysilicon layer 4 by etching.

In summary, the present invention provides the following advantages:

1. by using the etching process between the oxide layer spacer and the polysilicon as a substitution to the etching between the silicon nitride spacer and conjunctively the oxide layer and then filling with polysilicon known in the conventional approach, the present invention is well suitable for combining with the original method of manufacturing low parasitic capacitance bit line for stack DRAM;

2. since the oxide layer spacer is employed in the present invention, whose lower dielectric constant, in practice, allows to generate less significant parasitic capacitance than by using silicon nitride as in prior art.

The aforementioned descriptions simply illustrate the preferred embodiments of the present invention, rather than being intended to limit the present invention. All effectively equivalent modifications made by exploiting the specification of the present invention and appended drawings thereof without departing from the scope of the present invention are reasonably deemed as being included in the field of the present invention defined by the subsequent claims.

What is claimed is:

1. A method of manufacturing low parasitic capacitance bit line for stack dynamic random access memory (DRAM), comprising:
    offering a semi-conductor base, which semi-conductor base having an oxide, plural word line stacks, plural bit line stacks and plural polysilicons, which oxide being placed on the plural word line stacks and on the plural polysilicons not stacked with the plural bit line stacks thereon;
    applying a multi layer resist coat onto the upper surface of the semiconductor base;
    removing the multi layer resist coat to form holes, and further removing the part of the oxide located over the plural polysilicons in the hole to form contact holes exposing the polysilicons;
    depositing an oxide layer;
    etching the oxide layer to form plural oxide layer spacers;
    depositing a polysilicon layer;
    performing lithography and etching on the polysilicon layer thereby allowing the rest of the polysilicon layer which is column-shaped to form capacitor contacts; and
    using another oxide to fill into a space among the word line stacks and the capacitor contacts.

2. The method according to claim 1, wherein the semiconductor base includes an array and a periphery.

3. The method according to claim 2, wherein the plural word line stacks are adjacently placed in space with the plural polysilicons in the array, and the bit line stacks are stacked on parts of the plural polysilicons.

4. The method according to claim 2, wherein the height of the multi layer resist coat is greater than those of the plural word line stacks.

5. The method according to claim 4, wherein the multi layer resist coat is removed by means of lithography and etching.

6. The method according to claim 1, wherein the etching performed to remove the oxide layer is anisotropic etching.

7. The method according to claim 1, wherein the height of the polysilicon is greater than the one of the bit line stack.

8. The method according to claim 7, wherein the part of the polysilicon which is higher than the bit line stack is removed by means of chemical machine polishing, and the upper surface of the polysilicon is planarized by grind polishing.

9. The method according to claim 1, wherein the method used to fill the oxide into the space among the word line stacks and the capacitor contacts is Spin on Glass (SOG) method.

10. The method according to claim 1, wherein the method used to fill the oxide into the space among the word line stacks and the capacitor contacts is Spin on Deposition (SOD) method.

11. The method according to claim 1, wherein the method used to fill the oxide into the space among the word line stacks and the capacitor contacts is borophosphosilicate glass (BPSG) deposition.

12. A method of manufacturing low parasitic capacitance bit line for stack dynamic random access memory (DRAM), comprising:

offering a semi-conductor base, which semi-conductor base having an oxide and plural polysilicons, which oxide being placed on the plural polysilicons;

applying a multi layer resist coat onto the upper surface of the semiconductor base;

removing part of the multi layer resist coat, and further removing the part of the oxide located on the plural polysilicons to form contact holes exposing the polysilicons;

depositing an oxide layer;

etching the oxide layer to form plural oxide layer spacers;

depositing a polysilicon layer; and performing lithography and etching on the polysilicon layer thereby allowing the rest of the polysilicon layer which is column-shaped to form capacitor contacts.

13. The method according to claim 12, wherein in offering the semiconductor base, the semiconductor base further includes plural word line stacks and plural bit line stacks, and the oxide is placed on the plural word line stacks and on the plural bit line stacks not stacked with the plural word line stacks.

14. The method according to claim 13, wherein the multi layer resist coat is removed by means of lithography and etching.

15. The method according to claim 13, wherein the height of the polysilicon is greater than the one of the bit line stack.

16. The method according to claim 15, wherein the part of the polysilicon which is higher than the bit line stack is removed by means of chemical machine polishing, and the upper surface of the polysilicon is planarized.

17. The method of manufacturing low parasitic capacitance bit line for stack DRAM according to claim 12, wherein the etching performed to remove the oxide layer is anisotropic etching.

18. The method according to claim 12, wherein after formation of the capacitor contact, another oxide is used to fill into a space among word line stacks and the capacitor contacts.

* * * * *